(12) United States Patent
Brown et al.

(10) Patent No.: US 6,633,950 B1
(45) Date of Patent: Oct. 14, 2003

(54) NONVOLATILE WRITEABLE MEMORY WITH PREEMPTION PIN

(75) Inventors: Charles W. Brown, Folsom, CA (US); Peter K. Hazen, Auburn, CA (US)

(73) Assignee: Intel Corporation, Santa Clara, CA (US)

( * ) Notice: Subject to any disclaimer, the term of this patent is extended or adjusted under 35 U.S.C. 154(b) by 4 days.

(21) Appl. No.: 09/653,768

(22) Filed: Sep. 1, 2000

Related U.S. Application Data

(62) Division of application No. 08/717,214, filed on Sep. 20, 1996, now Pat. No. 6,201,739.

(51) Int. Cl.[7] .............................................. G06F 12/00
(52) U.S. Cl. ..................................................... 711/103
(58) Field of Search ......................................... 711/103

(56) References Cited

U.S. PATENT DOCUMENTS

| | | | | |
|---|---|---|---|---|
| 4,965,828 A | * | 10/1990 | Ergott, Jr. et al. ............. 380/50 |
| 5,021,996 A | * | 6/1991 | Watanabe ..................... 714/29 |
| 5,255,314 A | * | 10/1993 | Applegate et al. ........... 379/212 |
| 5,287,469 A | * | 2/1994 | Tsuboi ........................ 711/103 |
| 5,321,651 A | * | 6/1994 | Monk ...................... 365/189.01 |
| 5,351,216 A | * | 9/1994 | Salt et al. ............... 365/230.01 |
| 5,355,464 A | * | 10/1994 | Fandrich et al. ............. 365/218 |
| 5,369,754 A | * | 11/1994 | Fandrich et al. ............. 711/103 |
| 5,377,145 A | * | 12/1994 | Kynett et al. ........... 365/185.22 |
| 5,414,829 A | * | 5/1995 | Fandrich et al. ............. 711/101 |
| 5,418,752 A | * | 5/1995 | Harari et al. ................. 365/218 |
| 5,422,843 A | * | 6/1995 | Yamada .................. 365/185.33 |
| 5,424,992 A | * | 6/1995 | Coffman et al. ............. 365/218 |
| 5,424,993 A | * | 6/1995 | Lee et al. ..................... 365/218 |
| 5,465,367 A | | 11/1995 | Reddy et al. ................ 365/222 |
| 5,521,864 A | * | 5/1996 | Kobayashi et al. ..... 365/185.22 |
| 5,542,076 A | | 7/1996 | Benson et al. .............. 710/260 |
| 5,568,644 A | * | 10/1996 | Nelson et al. ............... 710/268 |
| 5,590,073 A | * | 12/1996 | Arakawa et al. ........ 365/185.08 |
| 5,687,121 A | * | 11/1997 | Lee et al. ................. 365/185.11 |
| 5,742,787 A | * | 4/1998 | Talreja ........................ 711/103 |
| 5,805,929 A | | 9/1998 | Connolly et al. ............. 710/49 |
| 5,940,861 A | | 8/1999 | Brown et al. ................ 711/154 |
| 6,201,739 B1 | | 3/2001 | Brown et al. ........... 365/185.29 |

OTHER PUBLICATIONS

Dipert, Brian, Flash Memory Write Protection Techniques, Intel Application Note, Sep. 1993, pagers 11–43 to 11–49.
Macronix, Inc., Memory Data Book, Macronix America, Inc., Your One–Stop Shopping For Non–Volatile Memory, 1995–1996, pp. 45–1 to 45–2; 46–1 to 46–35; 47–1 to 47–2.

* cited by examiner

*Primary Examiner*—Reginald G. Bragdon
(74) *Attorney, Agent, or Firm*—Blakely, Sokoloff, Taylor & Zafman LLP

(57) ABSTRACT

A method and apparatus for preempting an operation in a nonvolatile writeable memory is performed using a pin. Preempting an operation is accomplished by either suspending the operation or by aborting the operation. Once an operation is suspended in the nonvolatile writeable memory, other operations can then be performed. Subsequently the suspended operation may be resumed.

12 Claims, 12 Drawing Sheets

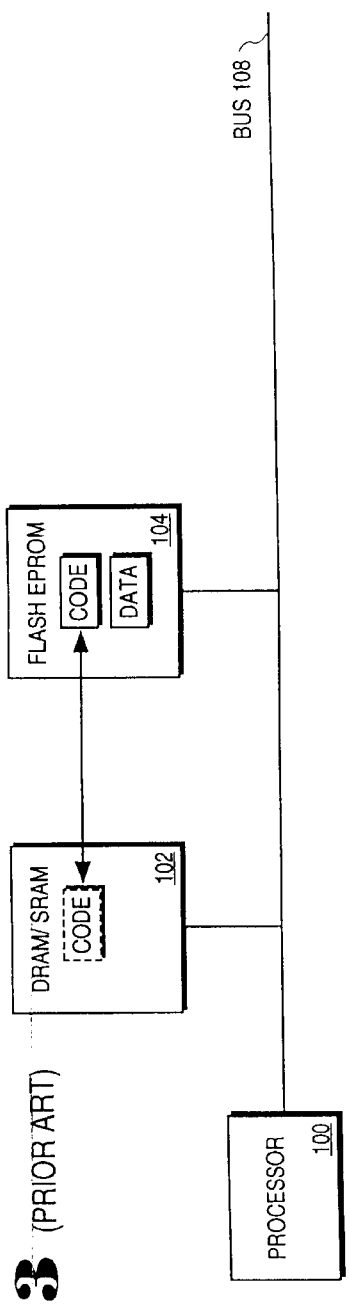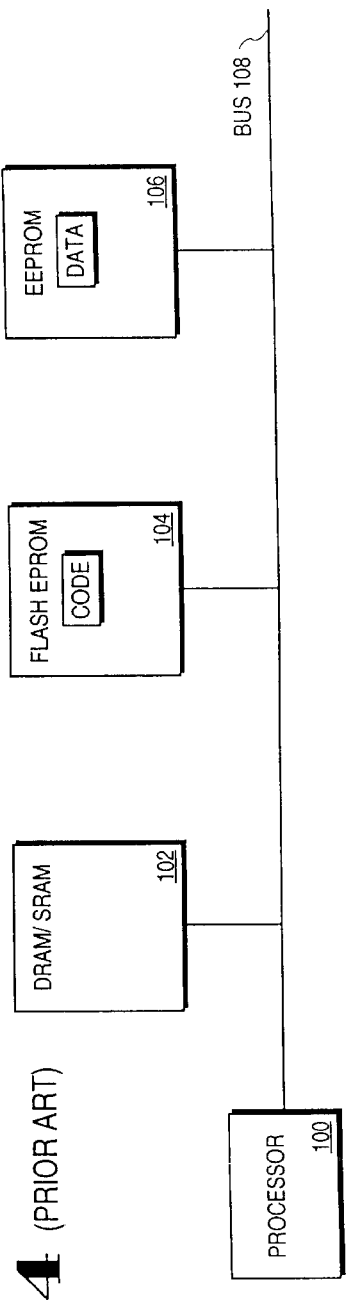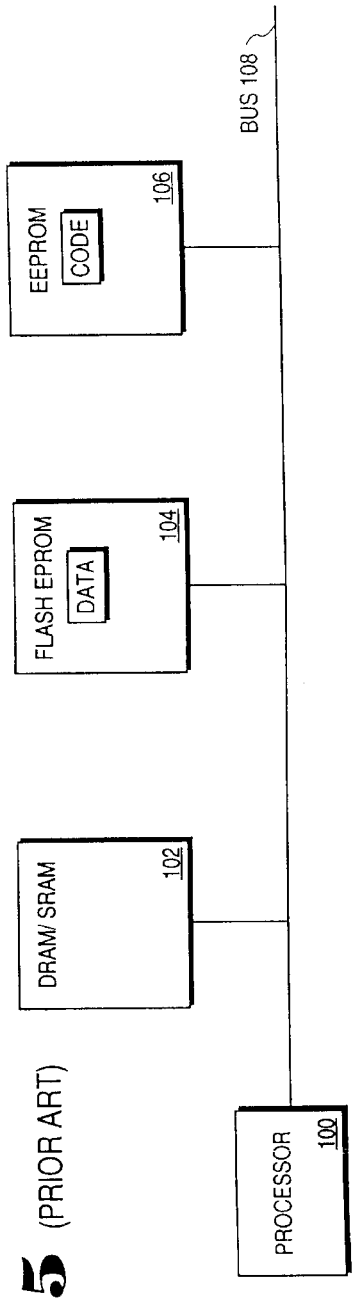

NONVOLATILE WRITEABLE MEMORY WITH PREEMPTION PIN

RELATED APPLICATIONS

The present application is a divisional application of Ser. No. 08/717,214 filed Sep. 20, 1996 entitled Nonvolatile Writeable Memory With Preemption Pin, now U.S. Pat. No. 6,201,739.

FIELD OF THE INVENTION

The present invention relates to the field of memory devices. More particularly, this invention relates to preempting an operation in a nonvolatile writeable memory.

BACKGROUND OF THE INVENTION

One type of prior art nonvolatile writeable memory is a flash Erasable and Electrically Programmable Read-Only Memory ("flash EPROM" or "flash memory"). A typical flash EPROM has the same array configuration as a standard Electrically Programmable Read-Only Memory ("EPROM") and can be programmed in a similar fashion as an EPROM. Once programmed, either the entire contents of the flash EPROM or a block of the flash EPROM can be erased by electrical erasure in one relatively rapid operation. An erasing voltage is made available to the sources of all the cells in the flash EPROM or in one block of the flash EPROM. This results in a full array erasure or a block erasure. The flash EPROM or the erased block of the flash EPROM may then be reprogrammed with new data.

Flash EPROMs differ from convention Electrically Erasable Programmable Read-Only Memory ("EEPROMs") with respect to erasure. Conventional EEPROMs typically use a select transistor for individual cell erasure control. Flash EPROMs, on the other hand, typically achieve much higher density with single transistor cells.

For a prior art single bit flash EPROM, a logical "one" means that few, if any, electrons are stored on a floating gate associated with a bit cell. A logical "zero" means that many electrons are stored on the floating gate associated with the bit cell. Erasure of the flash EPROM causes a logical one to be stored in each bit cell. Each single bit cell of the flash EPROM cannot be overwritten from a logical zero to a logical one without a prior erasure. Each single bit cell of that flash EPROM can, however, be written from a logical one to a logical zero, given that this entails simply adding electrons to a floating gate associated with the erased state.

Flash EPROMs may be read, programmed (or written), and erased. For a prior art flash EPROM, a program operation to write a byte of data typically takes on the order of 10 microseconds. Because, however, there is some margin required for guaranteeing that the program operation has properly completed, a maximum program time is specified by the flash EPROM manufacturer. Thus, while the typical program operation may take 10 microseconds, the system may need to wait a maximum program operation time of 100 microseconds in order to guarantee that the program operation performed correctly.

Similarly, for a prior art flash EPROM, an erase operation may take from 300–600 milliseconds in order to erase a 8 kilobyte block of data. However, the flash EPROM may require up to a maximum erase operation time of 3 seconds in order to guarantee that the erase operation of the entire block of data has performed correctly.

Because the erase operation has such a long latency time, a prior art flash EPROM includes an erase suspend command. When an erase suspend command is written to the flash EPROM, the flash EPROM suspends the erase operation that is being performed. Other operations may then be performed on the flash EPROM. Subsequently, when an erase resume command is written to the flash EPROM, the flash EPROM resumes the erase operation from where its operation was suspended due to the erase suspend command. An implementation of the erase suspend circuitry is described in U.S. Pat. No. 5,355,464, entitled "Circuitry And Method For Suspending The Automated Erasure Of A Non-Volatile Semiconductor Memory," by Fandrich et al., and issued to the common assignee of this application.

FIG. 1 shows a representation of a prior art flash EPROM 10. The flash EPROM includes a command register 20, memory array control circuitry 40, and memory array 50.

A number of data input/output (I/O) pins 12 are coupled from pins of the flash EPROM to a command register 20. The number of data I/O pins 12 is usually 8 pins or 16 pins, which matches the size of data to be stored to the flash EPROM. The data I/O pins 12 allow commands to be written to the command register 20. For example, for one prior art flash EPROM, the command decoder includes circuitry for decoding the following commands: (1) erase, (2) erase suspend, (3) erase resume, (4) program, (5) read, and (6) read status. A write enable (WE#) pin 30 is coupled to provide an input to the command register 20.

The command register 20 is coupled to memory array control circuitry 40 via signal lines 78a–n. The memory array control circuitry 40 includes a status register 42. The memory array control circuitry 40 also includes read circuitry, row and column decoder circuitry for accessing and providing data to cells in the memory array 50, and a write state machine, which includes program and erase circuitry. The memory array control circuitry 40 provides the appropriate signals to access the memory array 50 for carrying out the commands provided by the command register 20. The memory array control circuitry 40 receives an address input from address pins 44 of the flash EPROM. A command reset signal 48 is coupled from the memory array control circuitry 40 to the command register 20.

The memory array is coupled to provide data to an output multiplexer 60 for providing data to the data I/O pins 12 of the flash EPROM responsive to a read operation. The status register 42 is also coupled to provide data to the output multiplexer 60 for providing status data to the data I/O pins 12 of the flash EPROM responsive to a read status operation. The status register 42 provides information about the current operation being executed by the flash EPROM. The memory array control circuitry 40 controls the output multiplexer 60 based upon the commands provided to it from the command register 20. The memory array control circuitry 40 selects the status register output to pass through the output multiplexer 60 in response to a read status operation, and the memory array control circuitry selects the memory array output to pass through the output multiplexer 60 in response to a read operation.

In a prior art flash EPROM, a Ready/Busy (RY/BY#) pin 62 of the flash EPROM provides a status indicator of whether the flash EPROM is busy or not. The RY/BY# pin is "low" to indicate a busy state, which signifies that the flash EPROM is performing a block erase operation or a byte write operation. The RY/BY# pin is "high" to indicate a ready state, which signifies that the flash EPROM is ready for new commands, block erase is suspended, or the device is in a powerdown mode. The status register 42 is coupled to provide an output to the RY/BY# pin 62.

Additionally, a supply voltage Vcc, ground potential Vss, and a programming voltage Vpp are provided to the flash EPROM 10.

FIG. 2 shows a prior art block diagram of the command register 20 and the memory array control circuitry 40. The command register 20 includes a command decoder 70 and command latches 76a–n. The command latches include an erase latch 76a, an erase suspend latch 76b, an erase resume latch 76c, a program latch 76d, a read latch 76m, and a read status latch 76n.

The command decoder decodes the commands it receives from the data I/O pins 12. Each of the commands are provided to an associated command latch 76a–n via the signal lines 72a–n. The command latches 76a–n latch the command upon assertion of the write enable (WE#) pin 30. The command latches 76a–n provide the decoded command to the memory array control circuitry 40 via the signal lines 78a–n.

The memory array control circuitry includes erase circuitry 90, program circuitry 94, read circuitry 96, and read status circuitry 98. Erase circuitry 90 includes erase suspend circuitry 92. Read status circuitry 98 is coupled to the status register 42.

The erase latch 76a, erase suspend latch 76b, and the erase resume latch 76c are coupled to erase circuitry 90. The erase suspend latch 76b and erase resume latch 76c are coupled to erase suspend circuitry 92 within the erase circuitry 90.

The program latch 76d is coupled to program circuitry 94. The read latch 76m is coupled to read circuitry 96, and the read status latch 76n is coupled to read status circuitry 98.

The memory array control circuitry 40 is coupled to provide one or more command reset signals 48 to the command decoder for clearing the command latches 76a–n. The command decoder uses the command reset signals 48 to clear the command latches 76a–n via command latch reset signals 74a–n. For one implementation, there are individual command latch reset signals 74a–n coupled to each command latch 76a–n. For another implementation, one command latch reset signal is coupled to all of the command latches.

Flash EPROMs can be used to store both code and data. In one prior art usage, code is stored in certain blocks of the flash EPROM, and data is stored in other blocks of the flash EPROM. This allows for erasing one block without disturbing the contents of a different block. Additionally, some flash EPROMs provide for data blocks and code blocks of different sizes.

Although it is possible to store both code and data in a flash EPROM and execute code provided directly from the flash EPROM to a processor, a problem arises when a flash EPROM is used in a system that requires servicing of code fetches. This is due to the long latency times for program operations and erase operations, as was previously discussed. For example, if a processor were performing a program operation to write a byte of data to the flash EPROM, and subsequently the processor requested that the flash EPROM perform a read operation in order to perform a code fetch, i.e., a read of code to get new instructions for the processor to execute, the read operation may be delayed up to 100 microseconds waiting for the program operation to complete. This causes the processor to stall: the processor remains idle until it receives new instructions. Such a delay to read code would be unacceptable in a system that requires code fetches to be performed in less time than the maximum program operation time.

FIG. 3 shows a prior art representation of a system comprising a processor 100, a volatile memory 102, and a flash EPROM 104 coupled together via a bus 108. The volatile memory 102 and the flash EPROM 104, however, could be coupled to the processor 100, via separate buses. The flash EPROM includes both code and data, wherein the code is executable by the processor. The code of the flash EPROM is shadowed, or copied, to the volatile memory, which may be either dynamic random access memory (DRAM) or static random access memory (SRAM). After the code is shadowed in the volatile memory, if the flash EPROM is performing a program operation and the processor generates a code fetch request, then the processor can satisfy the code fetch request by reading the requested code from the volatile memory. The processor does not need to wait for the flash EPROM to finish its program operation in order to perform a code fetch.

This scheme, however, may be expensive if the size of the code stored in the flash EPROM is large, since the DRAM/SRAM would need to be large enough to store the entire code block in order to overcome the program operation latency. One example of a system which might use the configuration shown in FIG. 3 is a personal computer (PC).

FIG. 4 shows a prior art system including a processor 100, a volatile memory 102, a flash EPROM 104, and an EEPROM 106. In this prior art system, the EEPROM 106 stores data and the flash EPROM 104 stores code. The SRAM/DRAM 102 is used for temporarily storing data before providing the data to the EEPROM 106, i.e., the SRAM/DRAM serves as a buffer between the processor and the EEPROM.

FIG. 5 shows another prior art system in which the EEPROM 106 stores code, and the flash EPROM 104 stores data. The SRAM/DRAM 102 is used as a temporary buffer between the processor and the flash EPROM.

Thus, FIGS. 3, 4 and 5 show prior art flash EPROM systems that lack the ability to quickly and easily service a processor's code fetch requests while the flash memory is performing a program operation.

SUMMARY OF THE PRESENT INVENTION

An object of this invention is to provide an improved method of suspending an operation in a nonvolatile writeable memory. A desire of the invention is to provide a pin for preempting an operation in a nonvolatile writeable memory.

A method and apparatus for preempting an operation in a nonvolatile writeable memory is described. The nonvolatile writeable memory includes a preemption pin. The preemption pin suspends an operation being performed in the nonvolatile writeable memory.

Other objects, features, and advantages of the present invention will be apparent from the accompanying drawings and from the detailed description that follows below.

BRIEF DESCRIPTION OF THE DRAWINGS

FIG. 3 shows a prior art representation of a system comprising a flash EPROM, a processor and a volatile memory coupled together via a bus.

FIG. 4 shows a prior art system that uses an EEPROM to store data.

FIG. 5 shows another prior art system which uses an EEPROM to store code.

DETAILED DESCRIPTION

A method and apparatus for using a pin to preempt an operation in a nonvolatile writeable memory is described. Preempting an operation can be accomplished by either suspending the operation or aborting the operation. If the operation is suspended, the operation can be resumed at a later time. If the operation is aborted, the operation may either be restartable or non-restartable dependent upon the implementation. Although the detailed description describes embodiments using a flash EPROM, the invention may be used with any nonvolatile writeable memory, including, but not limited to EPROMs, EEPROMs, and flash memories, including technologies such as NOR, NAND, AND, DIvided bit-line NOR (DINOR), and Ferro-electric Random Access Memory (FRAM).

Figure 6:
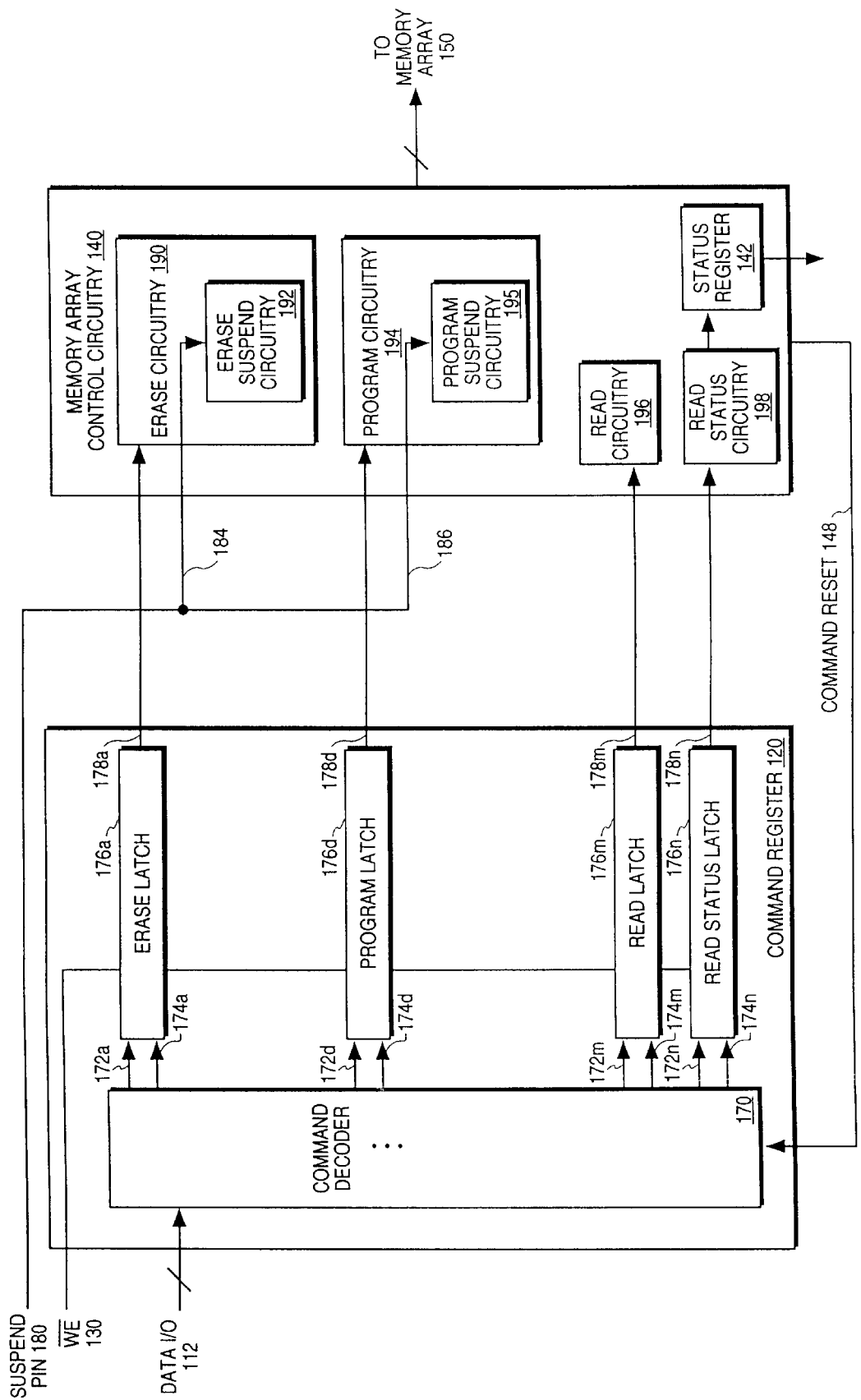
FIG. 6 shows a block diagram of the command register and the memory array control circuitry of a flash EPROM that includes a suspend pin.

FIG. 6 shows a block diagram of the command register 120 and the memory array control circuitry 140 of a flash EPROM that includes a suspend pin 180.

The command decoder 170 decodes commands it receives from the data I/O pins 112. The commands are latched into command latches 176a–n. An erase latch 176a latches an erase command. A program latch 176d latches a program command. A read latch 176m latches a read command. A read status latch 176n latches a read status command.

When an erase command is latched by the erase latch 176a, the erase latch 176a provides a signal via signal line 178a to the erase circuitry 190 to perform an erase operation on the memory array 150 (not shown). Similarly, when a program command is latched by the program latch 176d, the program latch 176d provides a signal via signal line 178d to the program circuitry 194 to perform a program operation on the memory array 150 (not shown).

The memory array control circuitry 140 includes erase circuitry 190 and program circuitry 194. The erase circuitry 190 includes erase suspend circuitry 192. The program circuitry 194 includes program suspend circuitry 195. The suspend pin 180 provides an input to both the erase suspend circuitry 192 and the program suspend circuitry 195.

When an erase operation is being performed by the flash EPROM and the suspend pin 180 provides a suspend signal via signal line 184 to the erase suspend circuitry 192, the erase operation will be suspended. Similarly, when a program operation is being performed by the flash EPROM and the suspend pin 180 provides a suspend signal via signal line 186 to the program suspend circuitry 192, the program operation will be suspended.

Figure 1:
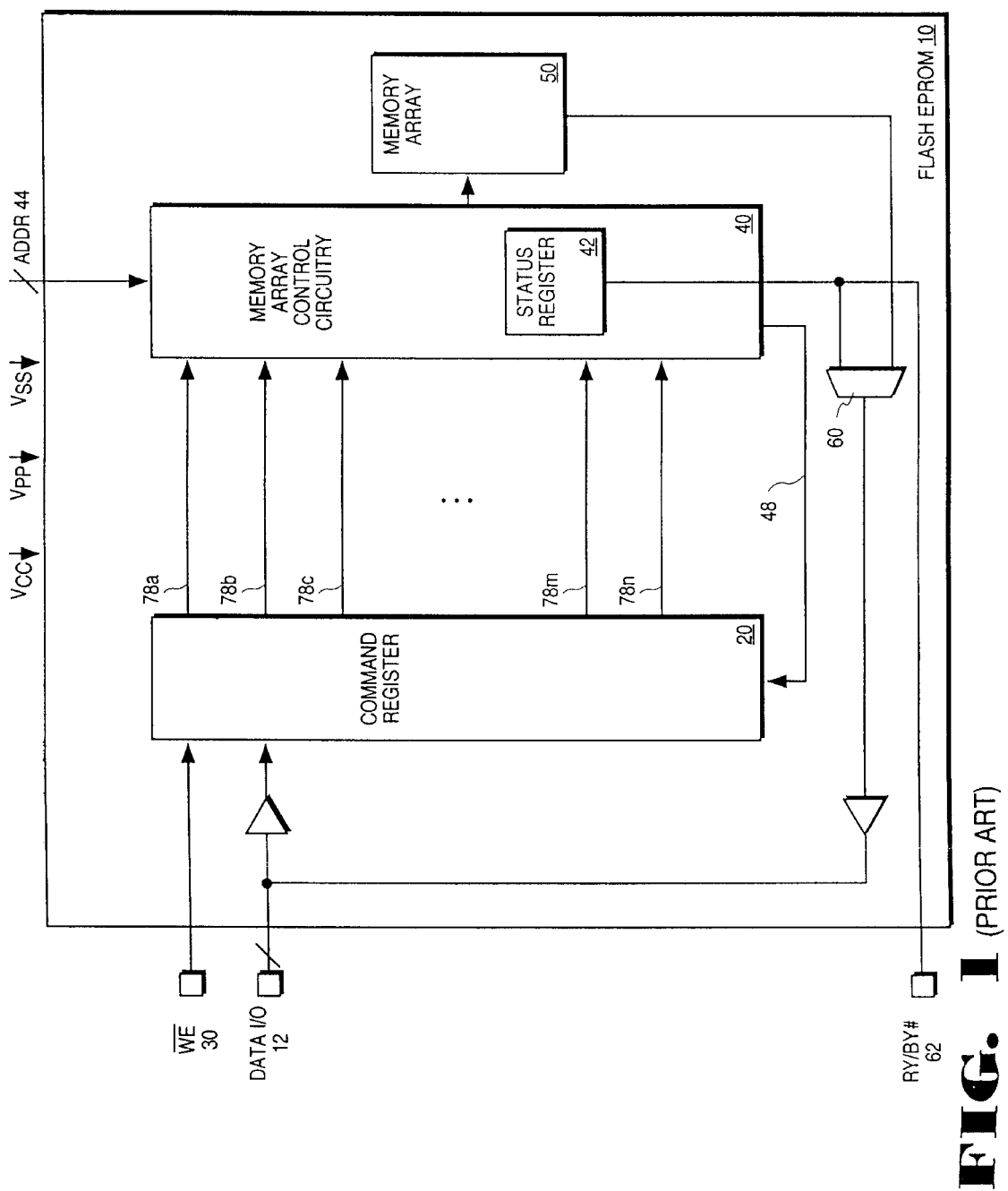
FIG. 1 shows a prior art representation of a flash EPROM.
Figure 2:
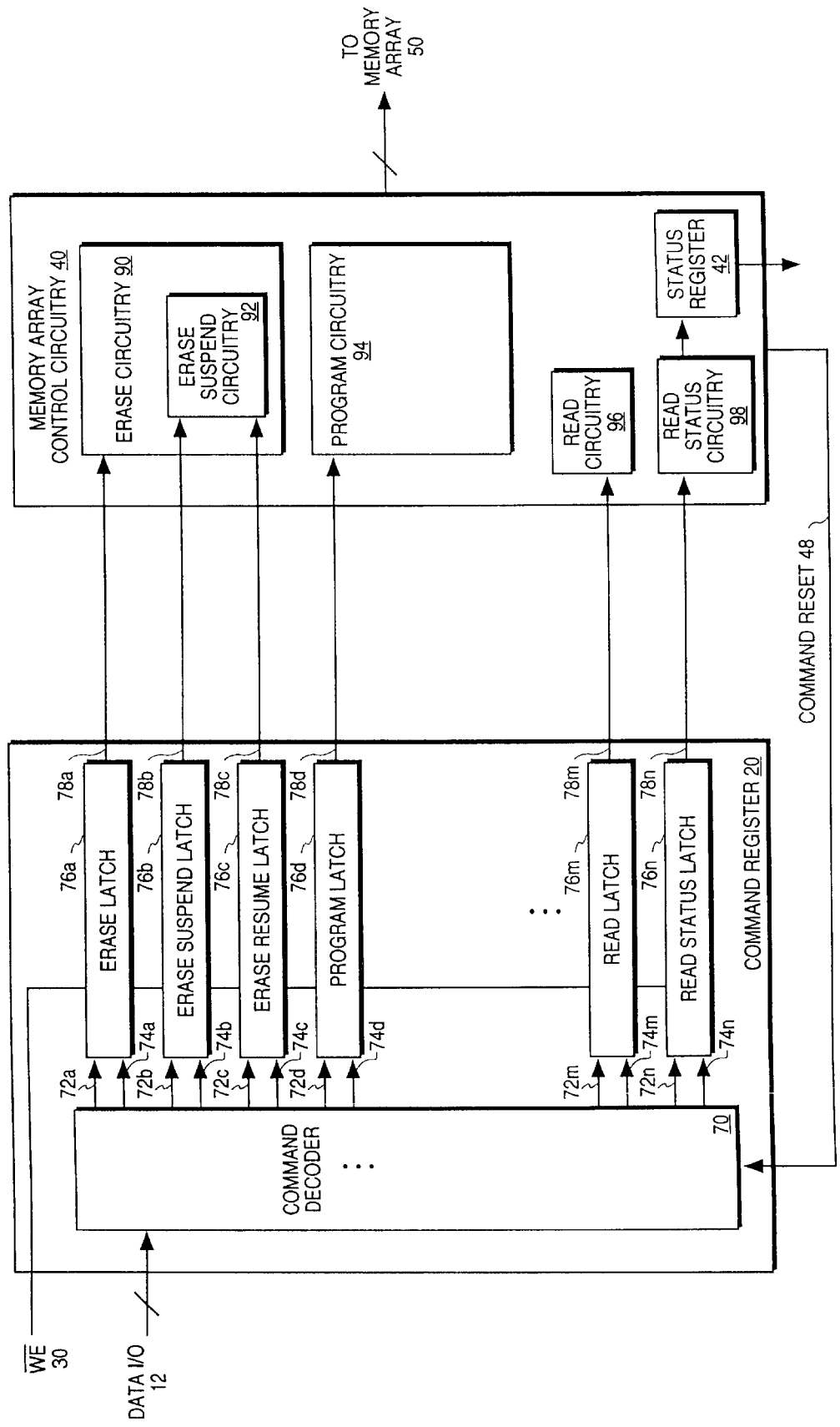
FIG. 2 shows a prior art block diagram of the command register and the memory array control circuitry of the flash EPROM.

The read circuitry 196 is used to perform read operations on the memory array of the flash EPROM, similar to that described with respect to FIG. 2. The read status circuitry 198 and the status register 142 are used to provide a status of the current state of the flash EPROM. A command reset signal 148 is provided to the command decoder 170 for resetting the command latches 176a–n.

Figure 7:
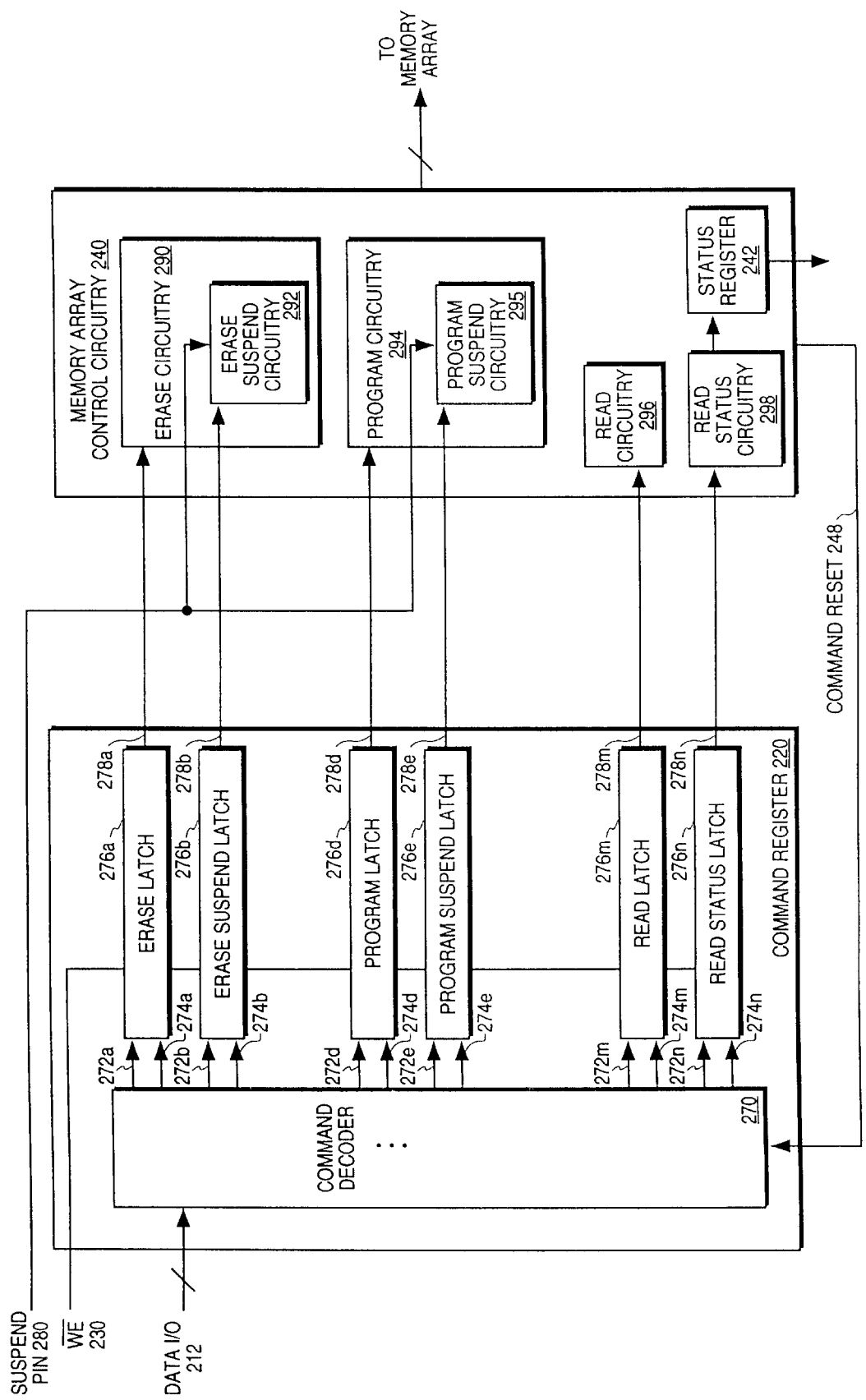
FIG. 7 shows an embodiment of a command register and a memory array control circuitry of a flash EPROM that includes a suspend pin and a program suspend latch.

FIG. 7 shows another embodiment of a command register 220 and a memory array control circuitry 240 of a flash EPROM that includes a suspend pin 280.

The command register 220 is similar to the command register 120 of FIG. 6, however, the command decoder 270 of FIG. 7 is able to decode a suspend command. When a suspend command is written to the command decoder 270 and it was preceded by an erase command, the command decoder provides a signal via signal line 272b to erase suspend latch 276b. When a suspend command is written to the command decoder 270 and it was preceded by a program command, the command decoder provides a signal via signal line 272e to program suspend latch 276e. The command latches 276a–n are latched upon the assertion of the WE# pin 230.

An erase operation can be suspended by either providing a signal to the suspend pin 280 while an erase operation is being performed, or by writing a suspend command to the command decoder 270 while an erase operation is being performed. Similarly, a program operation can be suspended by either providing a signal to the suspend pin 280 while a program operation is being performed, or by writing a suspend command to the command decoder 270 while a program operation is being performed. Note that the erase suspend command is prior art.

For one embodiment, the command decoder also decodes a resume command. The resume command resumes the last operation that was suspended. If an erase operation was suspended and a resume command is written to the command decoder, then the erase suspend latch is cleared by command latch reset signal 274b. If a program operation was suspended and a resume command is written to the command decoder, then the program suspend latch is cleared by command latch reset signal 274e. For one embodiment, the resume command has the same bit pattern as the suspend command. The resume command and the suspend command are differentiated by the time at which they occur and by the operation currently being performed.

Figure 8:
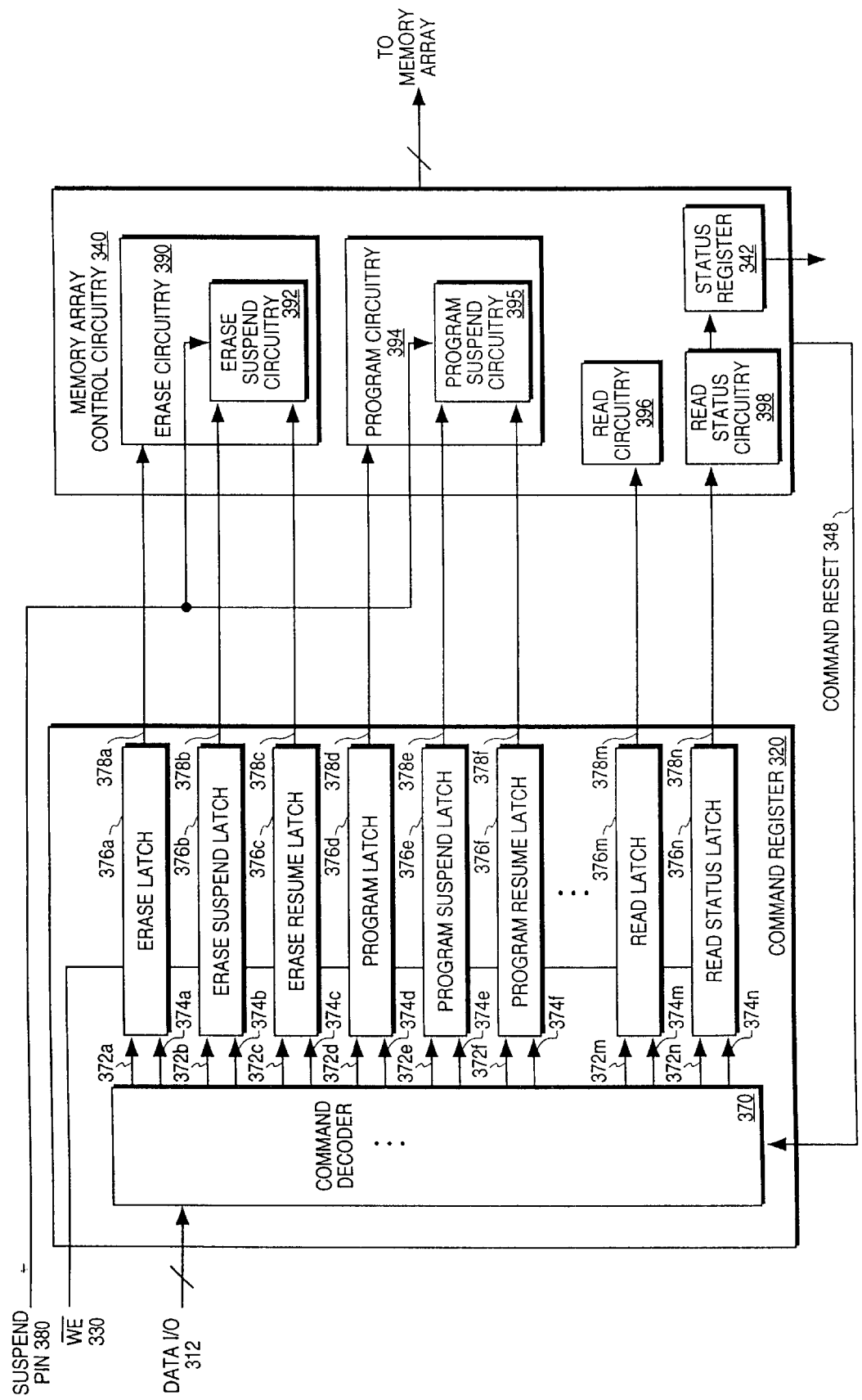
FIG. 8 shows another embodiment of a command register and a memory array control circuitry of a flash EPROM that includes a suspend pin and program suspend and resume latches.

FIG. 8 shows another embodiment of a command register 320 and a memory array control circuitry 340 of a flash EPROM that includes a suspend pin 380.

The command decoder 370 decodes the following commands: (1) erase, (2) suspend, (3) resume, (4) program, (5) read, and (6) read status. The command decoder provides the decoded command to a corresponding command latch 376a–n via signal lines 372a–n. The command latches 376a–n are latched upon assertion of the write enable (WE#) pin 330.

The command latches 376a–n include program suspend latch 376e and program resume latch 376f. The program suspend latch 376e latches a signal 372e to suspend a program operation. For one embodiment, this occurs when a suspend command is written to the command decoder 370 while a program operation is being performed. For this embodiment, the suspend command is also used to suspend erase operations. This is accomplished by writing the suspend command while an erase operation is being performed. For another embodiment, a unique program suspend command that is different from an erase suspend command is written to the command decoder. The program suspend command suspends a program operation so that other operations, such as a read from the memory array, can be performed.

The program resume latch 376f latches a signal to resume a program operation. For one embodiment, this occurs when a resume command is written to the command decoder 370 after a program operation was suspended. For another embodiment, a unique program resume command that is different from an erase resume command is written to the command decoder 370.

The resume and suspend commands work in combination with the suspend pin 380. Thus, it is possible to suspend a program operation, for example, by either writing a program suspend command to the command decoder 370 or by asserting the suspend pin 380. The erase suspend and resume commands work in a similar fashion on the erase command. Note that the erase suspend and resume commands are prior art.

Figure 9:
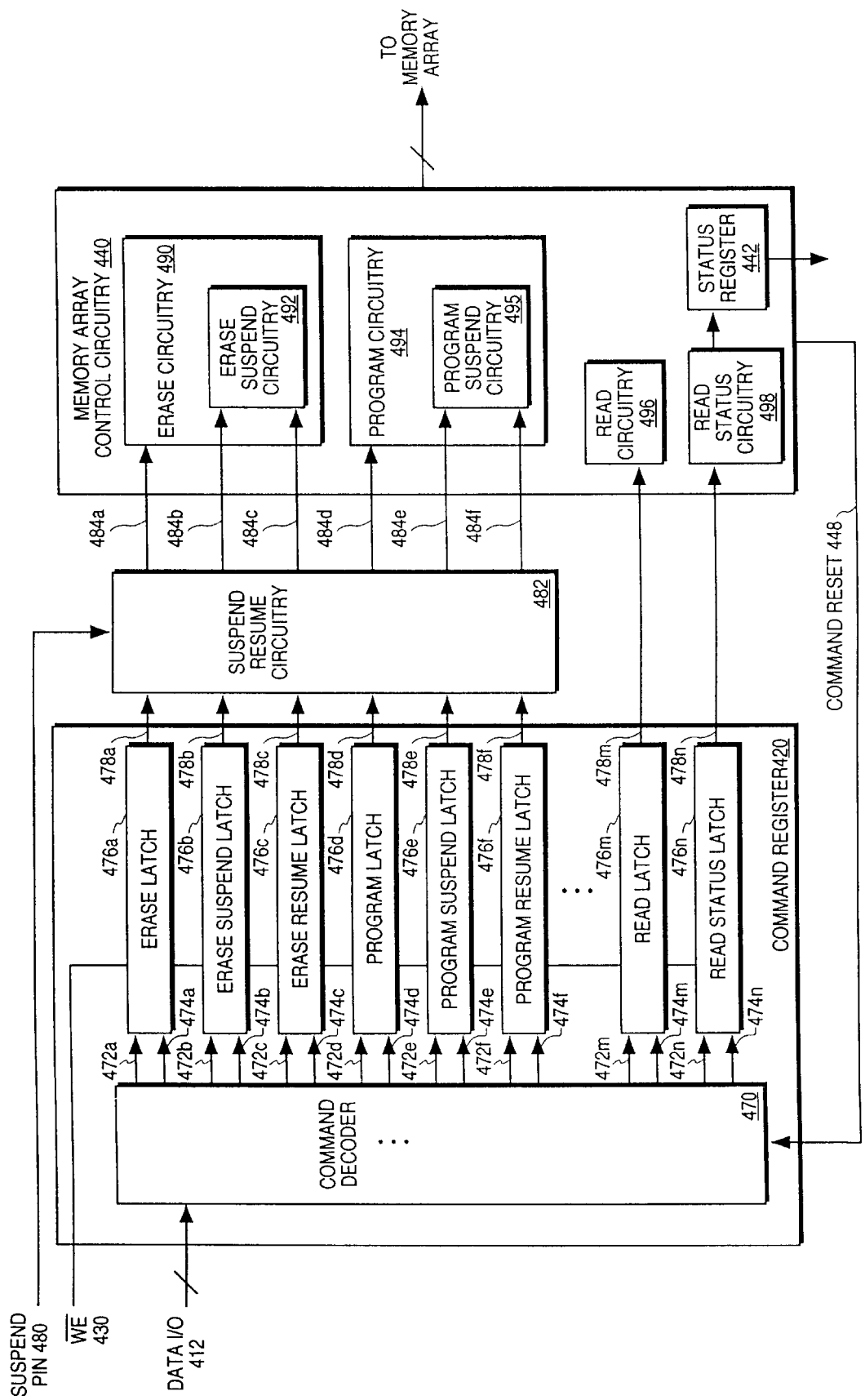
FIG. 9 shows an embodiment of a command register and a memory array control circuitry that includes suspend/resume circuitry.

FIG. 9 shows an embodiment of a command register 470 and a memory array control circuitry 440 that includes suspend/resume circuitry 482. The suspend pin 480 is coupled to provide an input to the suspend/resume circuitry 482.

For one embodiment, the command decoder 470 decodes the following commands: (1) erase, (2) erase suspend, (3) erase resume, (4) program, (5) program suspend, (6) program resume, (7) read, and (8) read status. The command decoder provides the decoded command to a corresponding command latch 476a–n via signal lines 472a–n. The command latches 476a–n are latched upon assertion of the write enable (WE#) pin 430.

The erase latch 476a is coupled to the erase circuitry 490 via the signal line 478a, the suspend/resume circuitry 482, and the signal line 484a. The erase suspend latch 476b is coupled to the erase suspend circuitry 492 of the erase circuitry 490 via the signal line 478b, the suspend/resume circuitry 482, and the signal line 484b. The erase resume latch 476c is coupled to the erase suspend circuitry 492 of the erase circuitry 490 via the signal line 478c, the suspend/resume circuitry 482, and the signal line 484c.

The program latch 476d is coupled to the program circuitry 494 via the signal line 478d, the suspend/resume circuitry 482, and the signal line 484d. The program suspend latch 476e is coupled to the program suspend circuitry 495 of the program circuitry 494 via the signal line 478e, the suspend/resume circuitry 482, and the signal line 484e. The program resume latch 476f is coupled to the program suspend circuitry 495 of the program circuitry 494 via the signal line 478f, the suspend/resume circuitry 482, and the signal line 484f.

The read latch 476m is coupled to the read circuitry 496 via signal line 478m, and the read status latch 476n is coupled to the read status circuitry 498 via signal line 478n. The read status circuitry 498 is coupled to status register 442, which is coupled to provide status output to the data I/O and RY/BY# pins.

The memory array control circuitry 440 is coupled to provide one or more command reset signals 448 to the command decoder 470 for clearing the command latches 476a–n. The command decoder 470 uses the command reset signals 448 to clear the command latches 476a–n via command latch reset signals 474a–n. For one embodiment, there are individual command latch reset signals coupled to each command latch 476a–n. For another embodiment, one command latch reset signal is coupled to all of the command latches.

For one embodiment, the program suspend command and the program resume command are the same command, but are distinguished from each other based on when they occur. Each time the program suspend/program resume command is written to the command decoder, the command decoder toggles between providing a program suspend command to the program suspend latch 476e or a program resume command to the program resume latch 476f.

For another embodiment, the program suspend command and the erase suspend command are the same command, but are distinguished from each other based on when they occur. If an erase operation is being performed when the suspend command is written to the command decoder, then an erase suspend will issue. If a program operation is being performed when the suspend command is written to the command decoder, then a program suspend will issue. Furthermore, the program resume and the erase resume commands can be the same as the program suspend/erase suspend commands. The command decoder 470 keeps track of the last operation that was suspended. When the "suspend-resume" command is written to the command decoder 470 while idle or a non-suspendable operation is being performed, then the last operation that was suspended is resumed. Suspended operations can be nested, as will be described with reference to FIG. 14.

For one embodiment, the suspend/resume circuitry 482 resides within the command register 420. For another embodiment, the suspend/resume circuitry 482 resides within the memory array control circuitry 440.

The suspend/resume circuitry 482 provides an erase signal 484a, an erase suspend signal 484b, an erase resume signal 484c, a program signal 484d, a program suspend signal 484e, and a program resume signal 484f to the memory array control circuitry 440.

The memory array control circuitry 440 interprets the command signals provided to it and performs a corresponding operation in response to the command signals. The memory array control circuitry 440 includes program suspend circuitry 495 for suspending a program cycle of the memory array 450. The memory array control circuitry 440 also includes prior art erase suspend circuitry 492 for suspending an erase cycle of the memory array 450. The memory array control circuitry includes a means for storing the state of the suspended non-read cycle so that the non-read cycle can be resumed later. Non-read cycles include program cycles and erase cycles in the following discussion. For an alternate embodiment, other types of cycles, including, but not limited to, command cycles and status retrieving cycles, can also be suspended.

A suspend pin 480 provides an input to the flash EPROM 410 for preempting non-read cycles in order to perform a read cycle. The suspend pin 480 is coupled to the suspend/resume circuitry 482. When a suspend signal is provided to the suspend pin 480 and an erase command is being performed (as would be indicated by the associated signal 478a being asserted), then the suspend/resume circuitry 482 provides an erase suspend signal 484b to the memory array control circuitry 440. The memory array control circuitry 440 suspends the erase cycle in response to the erase suspend signal 484b. After the erase cycle has been suspended, one or more operations can be performed by the flash EPROM. Subsequently, when a resume signal is provided to the suspend pin 480, the suspend/resume circuitry 482 provides an erase resume signal 484c to the memory array control circuitry 440 which initiates resumption of the erase cycle that was previously suspended.

Similarly, when a suspend signal is provided to the suspend pin 480 and a program command is being performed (as would be indicated by the associated signal 478d being asserted), then the suspend/resume circuitry 482 asserts a program suspend signal 484e to the memory array control circuitry 440. The memory array control circuitry 440 suspends the program cycle in response to the program suspend signal 484e. After the program cycle has been suspended, one or more operations can be performed by the flash EPROM. Subsequently, when a resume signal is provided to the suspend pin 480, then the suspend/resume circuitry 482 provides a program resume signal 484f to the memory array control circuitry 440 which initiates resumption of the program cycle that was previously suspended.

A program suspend operation completes its suspend of a program cycle within a predetermined amount of time to allow a read cycle to be performed with a specified latency. The program suspend operation is initiated either by writing a program suspend command to the command decoder 422 or by providing a suspend signal to the suspend pin while the flash EPROM is performing a program cycle. For one embodiment, the program suspend completes within 7 microseconds. After this predetermined amount of time, a read cycle can be performed on the flash EPROM.

Similarly, the erase suspend operation completes within a predetermined amount of time. The erase suspend operation may be initiated by the prior art method of writing an erase suspend command to the command decoder 422. Alternatively, the erase suspend can be initiated by asserting the suspend pin while the flash EPROM is performing an erase cycle. For one embodiment, suspending the erase operation completes within 20 microseconds. After this predetermined amount of time, other operations can be performed. Suspending the erase cycle via the suspend pin instead of the suspend command has the advantages of less system complexity and faster access by the preempting operation.

For one embodiment, it is possible to determine whether a program cycle or an erase cycle is being performed by accessing the status of the flash EPROM using the read status command. Status can also be determined by the RY/BY# pin 462 described previously. Alternatively, a separate pin could be used to provide an indication of whether a program cycle or whether an erase cycle were being performed.

Figure 10:
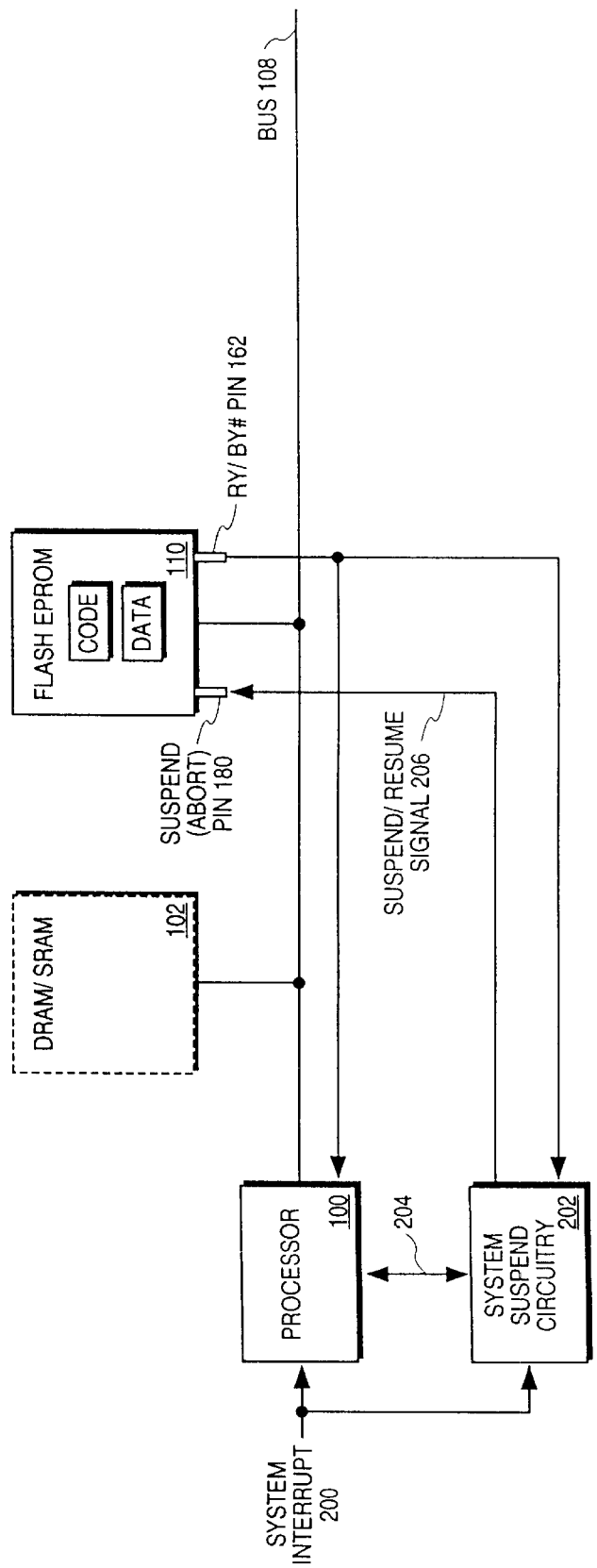
FIG. 10 shows one embodiment of a system employing the present invention.

FIG. 10 shows one embodiment of a system employing the present invention. A processor 100 is coupled to optional DRAM/SRAM 102 and the flash EPROM 110 via a bus 108. The flash EPROM 110 stores both code and data. A system interrupt 200 is provided to both the processor 100 and system suspend circuitry 202.

For one embodiment, the system suspend circuitry 202 is coupled to receive the system interrupt 200 that is provided to the processor 100. The system suspend circuitry is also coupled to the RY/BY# pin 162 of the flash EPROM 110.

For another embodiment, the system suspend circuitry 202 is coupled via various signals 204 to the processor 100. The system suspend circuitry 202 monitors address and control lines of the processor 100 to determine what the processor is doing. For example, via the signals 204, the system suspend circuitry can detect whether the processor is performing a code fetch or whether the processor is idle.

For yet another embodiment, the system suspend circuitry 202 resides within the processor 100.

The system suspend circuitry 202 provides a suspend signal 206 to the suspend pin 180 of the flash EPROM 110.

The configuration of FIG. 10 can be used in a wide range of systems, including personal computers, automotive and airplane control, cellular phones, digital cameras, and hand-held communication devices. The flash EPROM 110 is the only nonvolatile memory needed in the system, i.e., the configuration of FIG. 10 does not need an EEPROM. Additionally, the DRAM/SRAM 102 is optional. The system can comprise of solely a processor 100 and a flash EPROM 110.

By eliminating the DRAM/SRAM 102 from the system, the cost of the system is reduced. Additionally, the size of the system can also be reduced. This is particularly useful in smaller devices such as hand-held communication devices.

One system that may utilize the configuration of FIG. 10 is a cellular phone. The flash EPROM of FIG. 10 may store all three types of data that are typically stored in a cellular phone: (1) factory data (e.g., tuning parameters that the factory or service personnel set), (2) system related/network data (e.g., data indicating a service provider for the cellular phone), and (3) user data (e.g., phone numbers which the user has stored).

The cellular phone may also include various functions such as a dialing routine, a phone number programming routine, and a ringer routine. Each of the various routines may be implemented in code and stored in the flash EPROM 110.

Another device that may utilize the configuration of FIG. 10 is a hand-held communication device, such as a pager or personal organizers. Such a device may include code similar to that used in a cellular phone. The device may include a variety of types of data also. For one embodiment, an application program can be downloaded into the flash EPROM, i.e., written to the flash EPROM, and subsequently executed.

The suspend pin 180 is an input to the flash EPROM 110. The suspend pin 180 allows an operation being performed within the flash EPROM 110 to be suspended, for example, so that another operation can be performed. The suspended operation can be resumed at a later time.

For one implementation of the embodiments of FIGS. 6–10, the suspension of an operation is initiated by the assertion of the suspend pin. When the suspend pin is deasserted, then the suspended operation is resumed. For another implementation, the suspension is initiated by pulsing the suspend pin, i.e., the suspend pin is held in a high state for a predetermined amount of time and then is returned to a low state. The suspended operation is resumed when the suspend pin is pulsed again.

For another embodiment, the suspend pin of FIGS. 6–10 is replaced by an abort pin. The abort pin allows an operation being performed within the flash EPROM 110 to be aborted. The aborted operation may be restartable or not, dependent upon the implementation. Whether the pin 180 is used to suspend operations or to abort operations, the pin 180 preempts the operation currently being performed within the flash EPROM 110 so that another operation can be performed. For another embodiment, the flash EPROM includes both a suspend pin and an abort pin.

Figure 11:
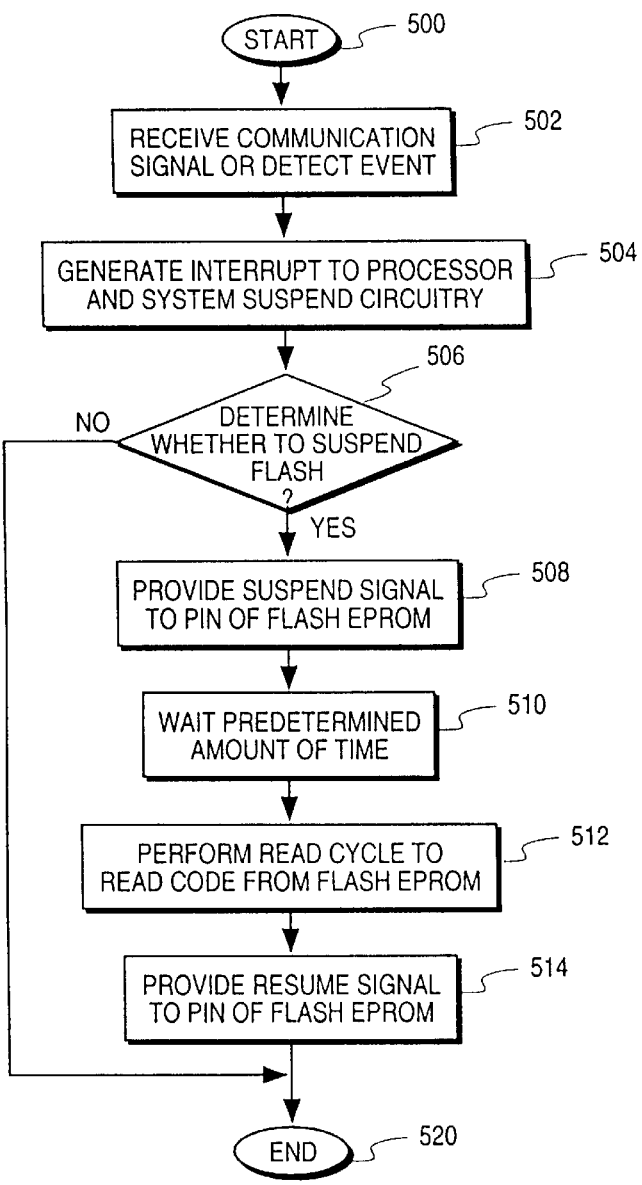
FIG. 11 is a flowchart showing exemplary steps taken by a system having the configuration shown in FIG. 6.

FIG. 11 is a flowchart showing exemplary steps taken by a system having the configuration shown in FIG. 10. The flowchart begins at block 500. Operation continues at block 502. At block 502, an event is detected, such as receiving a telephone call. At block 504, an interrupt is generated to the processor 100 and the system suspend circuitry 202. The system interrupt 200 results in the processor generating a code fetch request to the flash EPROM 110.

At block 506, the system suspend circuitry 202 determines whether to suspend the flash EPROM. The system suspend circuitry can monitor the RY/BY# pin of the flash EPROM in order to determine whether to suspend an operation being performed in the flash EPROM, as will be described with respect to FIG. 12. Alternatively, the system suspend circuitry can monitor the control bus and address bus of the processor 100 via signals 204 to determine whether it is appropriate to suspend the processor 100.

In one embodiment, all system interrupts cause the system suspend circuitry to generate a suspend signal to the flash EPROM. In another embodiment, only selective interrupts cause the flash EPROM to be suspended.

If the suspend circuitry 202 determines not to suspend the flash EPROM, then operation continues at block 520 at which the flowchart terminates. If the system suspend circuitry determines to suspend the flash EPROM, then operation continues at block 508, at which the system suspend circuitry provides a signal 206 to the suspend pin 180 of the flash EPROM 110 for suspending an operation being performed in the flash EPROM 110. From block 508, operation continues at block 510, at which the processor waits a predetermined amount of time to allow the non-read cycle that was pending to be suspended. For one embodiment, the waiting time terminates when the RY/BY# pin 162 transitions from a low state to a high state, indicating that the flash EPROM is no longer busy with an erase cycle or a program cycle.

Operation continues at block 512, at which the processor reads code from the flash EPROM. For one embodiment, the processor is performing in a system in which code must be fetched and executed within a predetermined amount of time. It should be noted, however, that the suspend pin can also be used to retrieve data instead of code.

At block 514, the system suspend circuitry 202 provides a signal 206 to the suspend pin 180 of the flash EPROM 110 for resuming the suspended operation. The system suspend circuitry is able to determine when to provide the signal 206 in its resume mode by monitoring the processor 100 via signals 204 or by monitoring the flash EPROM 110 via the RY/BY# pin 162.

For one embodiment, the processor uses an I/O port in order to get the system suspend circuitry 202 to suspend or resume operations in the flash EPROM 110. Thus, the processor writes to an I/O port to suspend an operation in the flash EPROM and subsequently writes to the I/O port again (or another I/O port) to resume the suspended operation in the flash EPROM.

Figure 12:
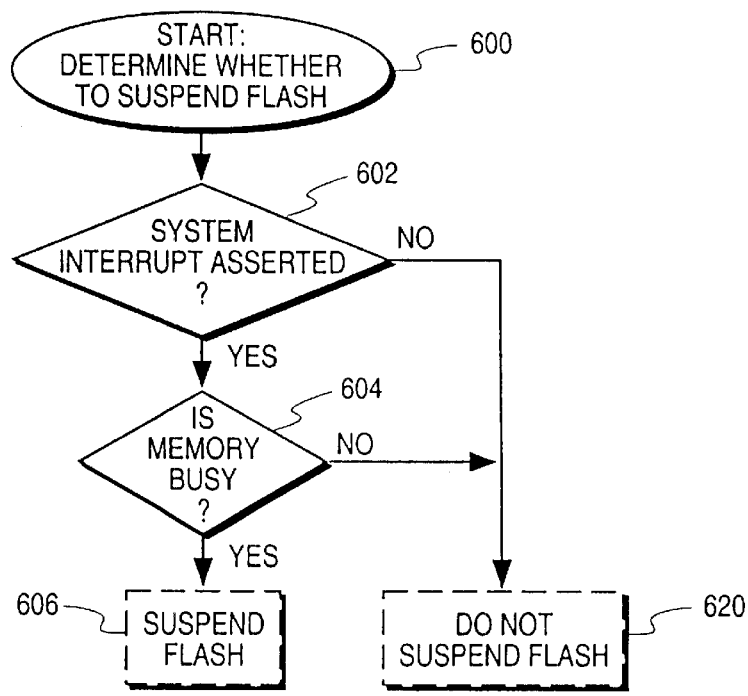
FIG. 12 is a flowchart showing the steps taken in one implementation for determining whether to suspend the flash EPROM corresponding to block 506 of FIG. 11.

FIG. 12 is a flowchart showing the steps taken in one implementation for determining whether to suspend the flash EPROM 110 corresponding to block 506 of FIG. 11.

The flowchart starts at operation block 600. Operation continues at decision block 602, at which a check is made to determine whether the system interrupt is asserted. If the system interrupt is not asserted then operation continues at block 620, at which the decision has been made to not suspend the flash EPROM.

At the block 602, if the system interrupt is asserted then operation continues at decision block 604. At block 604, if the flash EPROM is not busy, as indicated by a high output on the RY/BY# pin 162 of the flash EPROM, then operation continues at the block 620, at which the decision has been made to not suspend the flash EPROM.

At the block 604, however, if the flash EPROM is busy, as indicated by a low output on the RY/BY# pin 162, then operation continues at block 606, at which the decision has been made to suspend the flash EPROM. The appropriate procedures to suspend the flash EPROM are then carried out.

Figure 13:
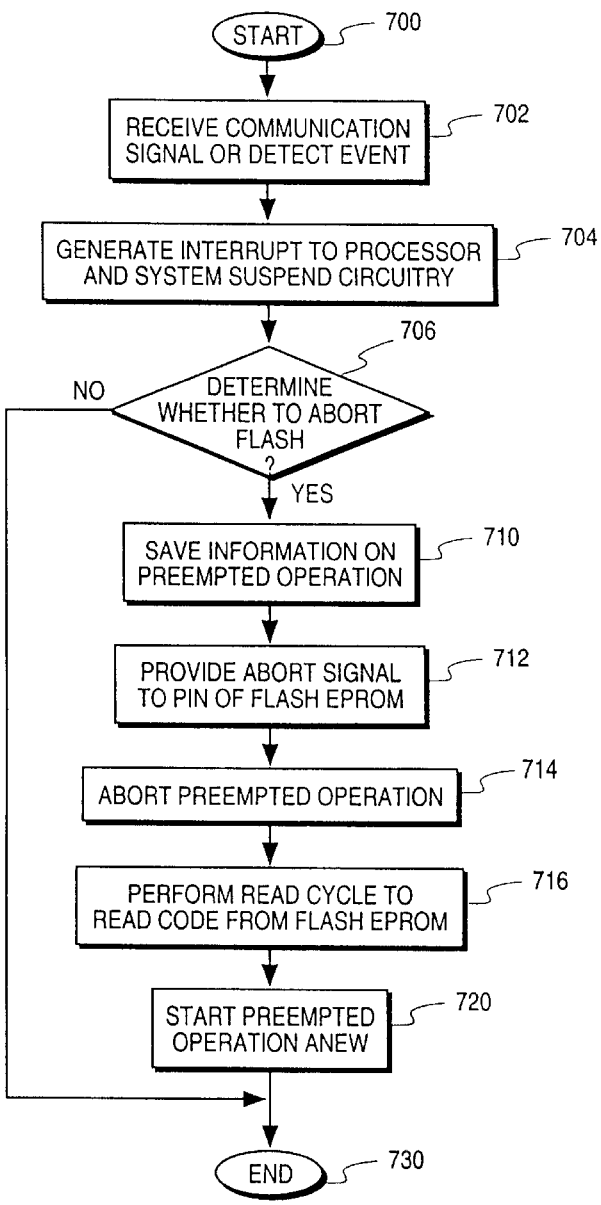
FIG. 13 is a flowchart showing the steps taken in an embodiment that aborts an operation in the flash EPROM.

FIG. 13 is a flowchart showing the steps taken in an embodiment that aborts an operation in the flash EPROM. The following example uses the structure of FIG. 10, wherein the pin 180 is used to abort an operation instead of suspending the operation. By aborting an operation, the latency time for waiting for a pending operation to be suspended can be avoided.

The flowchart starts at a block 700. Operation continues at block 702, at which a signal or event is detected. This gives rise to an interrupt being generated to the processor 100 and the system suspend circuitry 202 as shown at block 704. At block 706, a determination is made whether to abort the operation in the flash EPROM. For one embodiment, the decision to abort an operation is the same as that for suspending an operation, as was described with respect to FIG. 12.

If the operation is not to be aborted then the flowchart proceeds to block 730, at which operation terminates.

If, however, at block 706, the operation is to be aborted, then operation continues at block 710, at which information about the preempted operation, i.e., the pending operation, is saved. For one embodiment, the processor 100 or the suspend circuitry 202 keeps track of the last operation requested of the flash EPROM. For another embodiment, the flash EPROM is able to save information about the preempted operation internally.

Operation continues at block 712, at which an abort signal is provided to the pin 180. The preempted operation is aborted at block 714. At block 716, a read cycle is performed to read code from the flash EPROM.

At block 720, the preempted operation is started anew using the information that was saved at block 710. The flowchart terminates at block 730.

Thus, a pin of the flash EPROM allows an operation to be preempted by either suspending the operation, or by aborting the operation.

Figure 14:
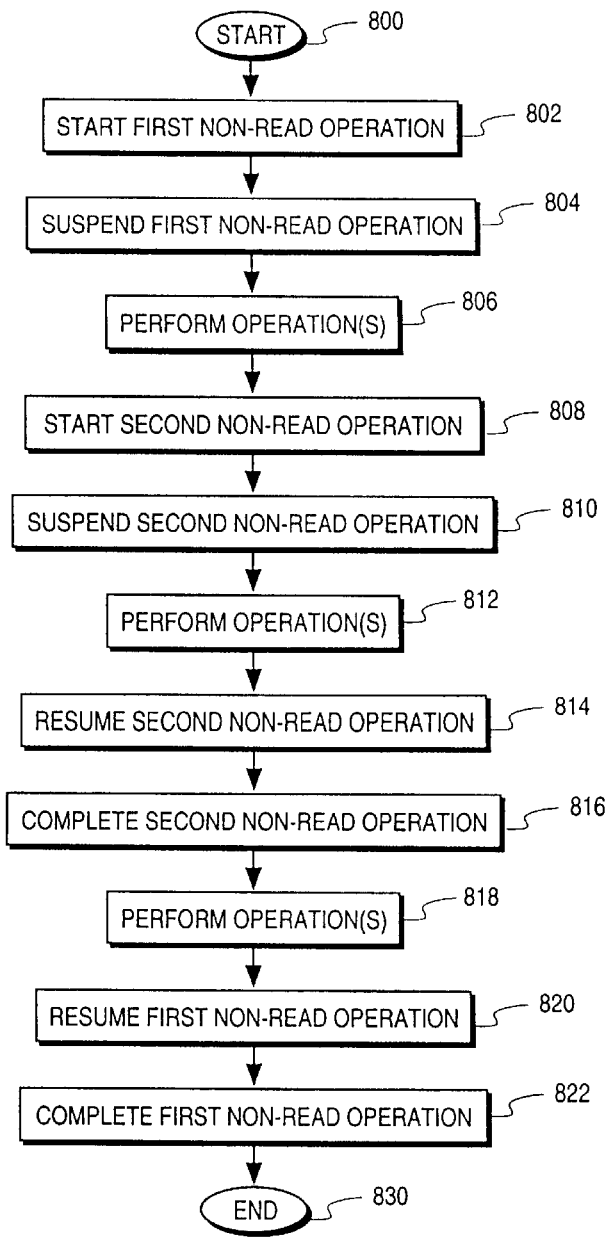
FIG. 14 is a flowchart showing that multiple operations may be suspended using a nesting technique.

FIG. 14 is a flowchart showing that multiple operations may be suspended using a nesting technique. The flowchart starts at block 800. Operation continues at block 802, at which a first non-read operation begins. For one embodiment, only the erase operation may be suspended as the first (or outer) nested suspended operation. In this embodiment, the erase operation has a relatively low priority, such that all other operations can preempt it. The program operation has a higher priority, such that only certain operations can preempt it. For another embodiment, the outer nested suspended operation may be an erase operation, a program operation, a read status operation, or a command operation.

At block 804, the first non-read operation is suspended. The suspend may be initiated by writing a suspend command to the flash EPROM 110. The suspend may also be initiated via the suspend pin 180. The suspended operation is not resumed until operations initiated during the suspended operation have completed. For one embodiment, the RY/BY# signal will transition to a high level to indicate that the flash memory is ready. A bit in the status word accessed via the read status command, however, indicates that an operation is suspended. For one embodiment, the status word includes one bit for indicating that an erase operation is suspended, one bit for indicating that a program operation is suspended, and one bit indicating whether the write state machine is busy.

At block 806, one or more other operations may be performed. For one embodiment, only certain operations are allowed after the first non-read operation is suspended. For example, if an erase operation has been suspended, then only the following operations will be allowed: read, program, program suspend, program resume, read status, and erase resume.

At block 808, a second non-read operation begins. For one embodiment, the second non-read operation is a program operation. The RY/BY# signal transitions to a low level to indicate that the flash memory is busy.

Operation continues at block 810, at which the second non-read operation is suspended. The RY/BY# signal transitions to a high level to indicate that the flash memory is ready.

One or more operations may be performed at block 812. For one embodiment, only certain operations are allowed while a program operation is suspended. For one embodiment, read, read status, and program resume are the only operations allowed.

At block 814, the second non-read operation is resumed. This is accomplished by providing a resume signal via the suspend pin 180 or by writing a resume command to the flash EPROM 110. The steps corresponding to blocks 810–814 may be performed multiple times during the second non-read operation.

At block 816, the second non-read operation completes. Operation continues at block 818, at which one or more operations may be performed.

At block 820, the first non-read operation is resumed by providing a resume signal via the suspend pin 180 or by writing a resume command to the flash EPROM 110. The steps corresponding to blocks 804–820 may be performed multiple times during the first non-read operation.

At block 822, the first non-read operation completes. The flowchart terminates at block 830.

Although the detailed description described embodiments using a flash EPROM, the invention may be used with any nonvolatile writeable memory, including, but not limited to EPROMs, EEPROMs, and flash memories, including technologies such as NOR, NAND, AND, DIvided bit-line NOR (DINOR), and Ferro-electric Random Access Memory (FRAM).

Some memory types may allow slight alterations in suspending operations. For example, for one embodiment, a NAND-type flash EPROM includes an SRAM buffer. The first access to read from this memory has a high latency time as a large amount of data (or code) is stored into the on-board SRAM buffer. Thus, if this flash EPROM were performing a program operation or an erase operation, and a processor preempted the non-read cycle to perform a code fetch, then the flash EPROM could suspend operation long enough to move the desired code into its SRAM buffer. Then the suspended operation could resume operation. The code fetch from the on-board SRAM buffer would then be performed in parallel with the non-read operation.

In the foregoing specification, the invention has been described with reference to specific exemplary embodiments thereof. It will, however be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. A nonvolatile memory, comprising:
   erase suspend circuitry connected to a memory array;
   a preemption pin connected to the erase suspense circuitry; and
   a command register connected to the erase suspend circuitry, wherein the erase suspend circuitry suspends an erase cycle of the memory array based on a preemption signal received from the preemption pin or the command register.

2. The nonvolatile memory of claim 1, further comprising erase resume circuitry that resumes the erase cycle based on a resume signal received on the preemption pin.

3. The nonvolatile memory of claim 1, wherein the suspended erase cycle is aborted.

4. The nonvolatile memory of claim 1, further comprising program suspend circuitry, wherein the preemption pin and the control register are connected to the program suspend circuitry which receives the preemption signal from the preemption pin or the command register and suspends a program cycle of the memory array based on the preemption signal.

5. A nonvolatile memory comprising:
   a command register that receives a preemption command to preempt an operation being performed by the nonvolatile memory;
   a preemption pin that receives a preemption signal to preempt the operation being performed by the nonvolatile memory without using a command so that the operation is suspended; and
   a memory control circuitry that preempts the operation being performed by the nonvolatile memory in response to a signal received from either the command register or the preemption pin.

6. The nonvolatile memory of claim 5 wherein the command register further comprises:
   a command decoder for decoding the preemption command.

7. The nonvolatile memory of claim 6 wherein the memory control circuitry further comprises:
   a suspend circuitry that initiates a suspend operation to suspend the operation being performed by the nonvolatile memory.

8. The nonvolatile memory of claim 7 wherein:
   the suspend operation is initiated by the suspend circuitry either by writing a suspend command to the command decoder or by asserting the preemption pin.

9. The nonvolatile memory of claim 8 wherein the memory control circuit further comprises:
   a resume circuitry that initiates a resume operation to resume a suspended operation, wherein the resume operation is initiated either by writing a resume command to the command decoder or by asserting the preemption pin.

10. A method of preempting an operation being performed by a nonvolatile memory, comprising:
    receiving a preemption signal on a preemption pin or from a command register; and
    preempting an operation being performed by the nonvolatile memory in response to the preemption signal received from either the preemption pin, or the command register.

11. The method of claim 10, further comprising resuming the suspended erase cycle.

12. The method of claim 10, wherein the suspended erase cycle is aborted.

* * * * *